March 11, 1969 S. B. MARANTZ 3,431,884

TUNING CONTROL FOR RADIO RECEIVERS

Filed Oct. 9, 1967

INVENTOR.
SAUL B. MARANTZ

BY Lester H. Clark
ATTORNEY

United States Patent Office 3,431,884

Patented Mar. 11, 1969

3,431,884

TUNING CONTROL FOR RADIO RECEIVERS

Saul B. Marantz, Kew Gardens, N.Y., assignor to Marantz Company Inc., Woodside, N.Y., a corporation of New York Filed Oct. 9, 1967, Ser. No. 673,548

U.S. Cl. 116—124.1 2 Claims

Int. Cl. H03j *1/02*

ABSTRACT OF THE DISCLOSURE

A tuning control for a radio receiver and the like in which the manually rotatable control member for variably adjusting a tuning element is a massive flywheel turning on a vertical axis.

This invention relates to a tuning control for radio receivers and the like, and more particularly, to an improved and simplified motion transmitting arrangement by means of which a tuning element and an indicator are operated by connection with a manually rotated control member.

The tuning element in a typical radio receiver is usually a variable capacitor whose capacitance is varied by movement of a manual control member so that the receiver may be tuned to any one of a range of frequencies. The manual control member also moves an indicator device so as to indicate with reasonable precision the frequency selected.

Known tuning arrangements have included a massive flywheel to permit easier spinning of the control knob and rapid change of the indicator along its scale. However, in these prior art arrangements the flywheel is located within the housing of the receiver and is connected to the manual control, usually a knob, through a shaft or a cable, or both.

Accordingly, it is a primary object of the present invention to provide an extremely simplified tuning control for a radio receiver and the like.

Another object is to enable very exact positioning and smooth operation of the tuning control.

Extreme simplicity in the tuning control of the present invention is attained by making the manual control member itself a massive flywheel, rotating on a vertical shaft. In other words, the flywheel itself is manually rotated by the operator when he desires to change the frequency to which the receiver is tuned.

Important consequences flow from the provision of a massive flywheel as the finger-adjustable control member. One is that the entire tuning system becomes much simpler and hence significant economy is realized in the construction of the tuning system. Thus, since the flywheel itself is the manually rotatable member, no knob is required for the tuning system. Further economies result from the fact that very inexpensive cone bearings may be utilized for mounting the flywheel shaft.

Also as a result of the simplification stemming from the use of a massive flywheel as the control member, most of the "stringing," that is, the configuration of the cord that links the tuning element and the indicator element with the control knob, lies substantially in one plane. The manually rotatable control member in the form of the aforesaid flywheel is rotated on a vertical axis. The shaft of the flywheel is rotatably mounted in conical bearings. Such conical bearings are relatively inexpensive, as noted above. They consist simply of screws with conical recesses machined into one end thereof, into which the conical ends of the flywheel shaft are fitted. One of these screws may be tightened sufficiently to make for a snug fit of the shaft in the conical recesses.

A segment of the flywheel projects through the front of the receiver casing so as to be engageable by the thumb or finger by the operator. The rim of the flywheel is knurled, or otherwise treated to make it readily movable. The tuning element, comprising a plurality of tuning capacitors, operates on a shaft which typically rotates on a horizontal axis, although it may be arranged to rotate on a vertical axis. A cord connects the shaft of the flywheel and the shaft of the tuning element.

Essentially, then, the present invention may be characterized as a tuning control or device comprising a manually rotatable control member in the form of a massive flywheel turning on a vertical shaft, and adapted to be directly manipulated by the operator for controlling a tuning element by an extremely simple linking arrangement.

The foregoing and other objects, features and advantages of the invention will be apparent from the following more particular description of preferred embodiments of the invention as illustrated in the accompanying drawings.

Figures 1, 2, 3:
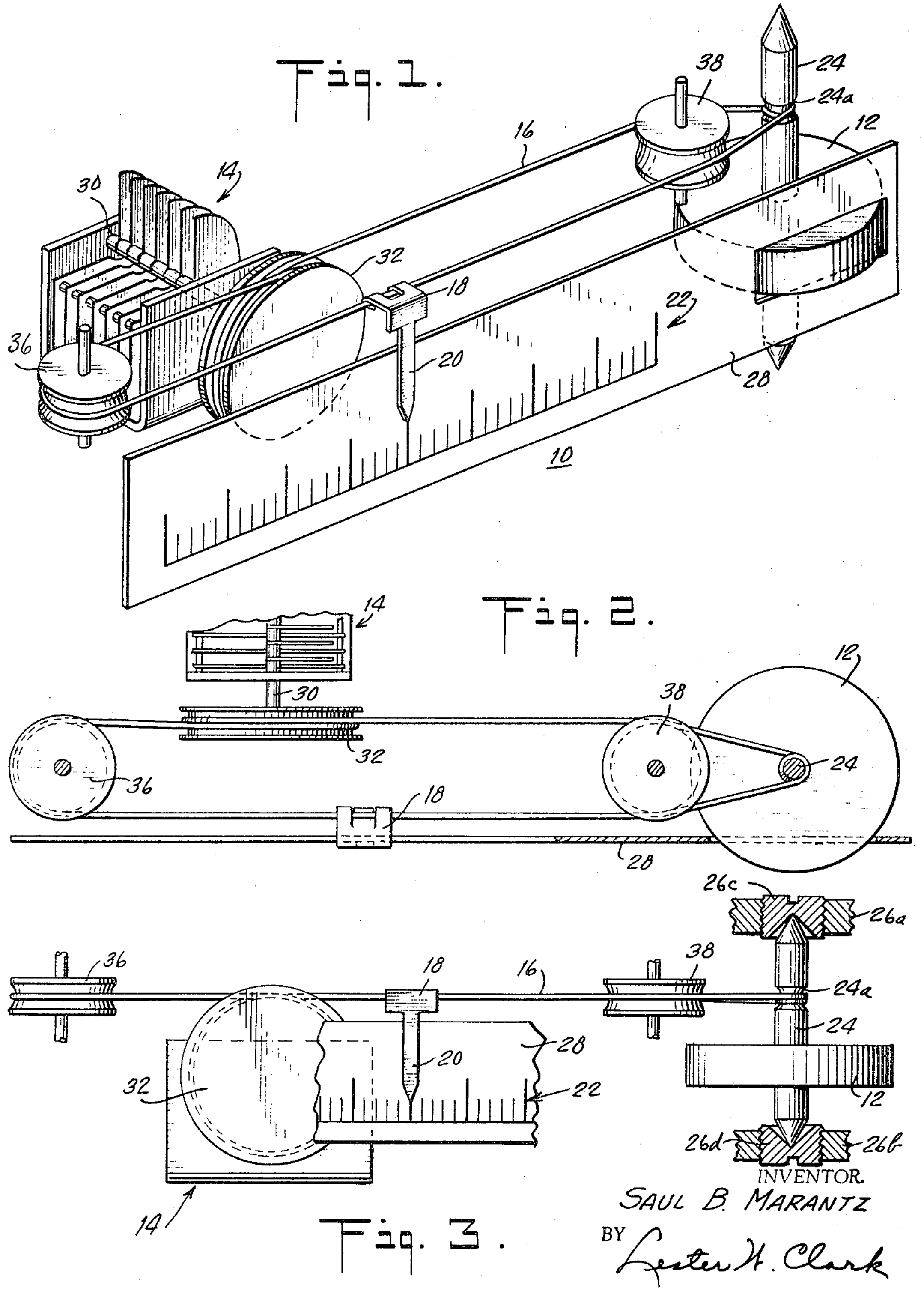
FIG. 1 is a perspective view of a preferred embodiment of the tuning control system constructed in accordance with the present invention.
FIG. 2 is an enlarged fragmentary plan view of the tuning control system.
FIG. 3 is an enlarged fragmentary elevation view of the tuning control system.

Referring now to the figures, there is shown a tuning control system 10 adapted to be mounted on a radio receiver chassis. This tuning control system is constituted basically by the manually rotated control member 12 and the tuning element 14 shown as a variable capacitor. These two elements are interconnected, whereby the control member 12 drives the tuning capacitor 14, by means of the belt 16. The belt 16 is a single nylon strand, for example, and it is fastened at its opposite ends to the ends of the indicator carrier 18.

The position of the indicator carrier 18 serves to indicate the particular frequency that has been selected from a predetermined plurality of frequencies and this is accomplished by means of a pointer 20 which moves across the face of a scale 22. For purposes of illustration only the indicator means has been shown in this particular form but any other equivalent type can, of course, be employed.

Referring now in particular to the manually rotated control member 12, this member essentially consists of a massive flywheel and this, as has been noted, may be considered, in relation to other elements, as constituting the essential feature of the present invention. It will be appreciated that the moment of inertia of this flywheel must be great as compared to the friction forces elsewhere in the tuning system. The mass of the flywheel is selected to be substantially greater than the mass of all the other elements forming the moving parts of the tuning system. Hence, the flywheel is constructed, for example, of high density material such as steel, and has a moment of inertia of the order of approximately 0.03 lb. in. squared.

The massive flywheel is arranged to rotate on a vertical axis. Thus, the flywheel 12 is affixed to a drive shaft 24 whose ends are mounted in conical bearings **26*a* and 26*b*. These conical bearings are of very simple construction and consist of screws 26*c* and 26*d* fitted into suitable supports. The screws 26*c* and 26*d* have conical recesses into which the ends of the flywheel shaft 24 are fitted. One or both of these screws can be tightened down to make for a snug fit of the shaft in the conical recesses. As will be noted, the shaft 24** has its ends milled to points at a smaller angle than the angle of the conical recesses. As a result, the spinning of the flywheel to accomplish the desired tuning is made extremely easy.

These simple cone bearings can only be practically used on a shaft which turns on a vertical axis, as shown.

A portion or segment of the flywheel 12 projects through the front panel 28 of the receiver casing. The periphery of flywheel 12 is shown as being knurled to allow for ease of adjustment in tuning.

The tuning capacitors 14 are operated by the rotation of the shaft 30 to which they are affixed. A drive pulley 32 is attached to one end of the shaft 30 and the belt 16 is wrapped around this capacitor drive pulley for one or more turns so that movement of the belt 16, responsive to the rotation of the control member 12, results in turning the drive pulley 32 and consequently the movable members of the tuning capacitors 14.

As indicated hereinabove, the belt 16 is in the form of a single strand and it extends from the indicator carrier 18 and thence for a half turn around an idler pulley 36. After its traverse of the circumference of the drive pulley 32, the belt 16 contacts a spacer pulley 38 along one side thereof. The function of this spacer pulley 38, of course, is to maintain the spacing between the front and rear reaches of the belt 16. Accordingly, the belt 16 engages the groove **24*a* in the shaft 24, and passes more than one complete turn around the shaft and contacts the opposite side of the spacer pulley 38. Thereafter, the belt 16 is affixed at its other end to the opposite end of the indicator 18. The belt 16 may be looped about the flywheel shaft 24** in any appropriate fashion, and, as an example, it is shown as looped for two turns around this shaft.

It will have become apparent that the configuration of the cord, that is, the belt 16, as it is extended in the aforenoted fashion, is in a single plane except for that part of the belt as it is wrapped around the drive pulley 32.

What has been described in accordance with the present invention is an extremely simple tuning control, especially in regard to the elimination of one conventional part, i.e., the control knob, and the use of less expensive bearings for the flywheel. This simplicity stems from the fact that the manually rotated control member comprises a massive element in the form of a flywheel which is directly manipulated by the operator, and which turns on a vertical axis.

While there have been shown and described and pointed out the fundamental novel features of the invention as applied to the preferred embodiments, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. Apparatus for tuning a radio set comprising a housing said housing having a front panel, a scale formed on said panel, a longitudinal slot formed in said panel and spaced from said scale, a movable tuning element mounted in said housing, an indicator for exhibiting the position of said element, a vertical shaft rotatably mounted in said housing and aligned with the vertical center line of said slot, a flywheel of specific mass fixed on said shaft with a segment of said flywheel projecting outwardly through said slot, cable guide means mounted in said housing, a drive cable operatively associated with said tuning element, indicator and shaft, said drive cable being operatively associated with said guide means whereby manual manipulation of said flywheel segment will cause said indicator to register with said scale to indicate the position of said tuning element.

2. Apparatus as defined in claim 1, including a pair of cone bearing means, respectively located at the top and bottom of said vertical shaft, for supporting and guiding it the rim of said flywheel being roughened to facilitate rotation thereof.

References Cited

UNITED STATES PATENTS

| | | | |
|---|---|---|---|
| 1,608,734 | 11/1926 | Grebe | 116—124.3 XR |
| 1,642,677 | 9/1927 | Grebe | 116—124.4 |
| 1,728,834 | 9/1929 | Langley | 74—10 |
| 1,782,368 | 11/1930 | Scheibel | 116—124.3 |

LOUIS J. CAPOZI, *Primary Examiner.*

U.S. Cl. X.R.

74—10